(12) United States Patent
Niki et al.

(10) Patent No.: US 7,292,116 B2
(45) Date of Patent: Nov. 6, 2007

(54) TEMPERATURE STABILIZER AND OSCILLATING APPARATUS

(75) Inventors: Shoji Niki, Tokyo (JP); Shin Masuda, Tokyo (JP)

(73) Assignee: Advantest Corporation, Tokyo (JP)

( * ) Notice: Subject to any disclaimer, the term of this patent is extended or adjusted under 35 U.S.C. 154(b) by 42 days.

(21) Appl. No.: 11/299,721

(22) Filed: Dec. 12, 2005

(65) Prior Publication Data

US 2006/0139116 A1    Jun. 29, 2006

(30) Foreign Application Priority Data

Dec. 13, 2004    (JP)    ............................. 2004-360520

(51) Int. Cl.
*H03L 1/00* (2006.01)
(52) U.S. Cl. .................. 331/176; 372/38.1; 372/38.01; 372/29.02
(58) Field of Classification Search ................ 359/459; 331/177 R, 176; 332/144; 372/38.1, 38.01, 372/29.02
See application file for complete search history.

(56) References Cited

U.S. PATENT DOCUMENTS 5,734,469 A * 3/1998 Strandjord ................... 359/459
6,529,534 B1 * 3/2003 Yasuda ......................... 372/32

* cited by examiner

*Primary Examiner*—Arnold Kinkead
(74) *Attorney, Agent, or Firm*—Osha Liang LLP (57) ABSTRACT

A temperature stabilizer for accurately stabilizing the temperature of an object is provided. The temperature stabilizer stabilizes the temperature of an object to a reference temperature. The temperature stabilizer includes an oscillator provided in proximity to the object, for generating an oscillation signal having a frequency corresponding to an inputted frequency control signal, a phase detector for detecting the phase difference between a feedback signal based on the oscillation signal and a reference clock signal having a predetermined frequency, a loop filter for generating the frequency control signal to synchronize the feedback signal with the reference clock signal based on the output from the phase detector, a comparator for comparing the value of the frequency control signal with a reference value determined corresponding to the reference temperature and an electric heating converter for heating or cooling the object based on the comparison result from the comparator.

8 Claims, 5 Drawing Sheets

TEMPERATURE STABILIZER AND OSCILLATING APPARATUS

BACKGROUND OF THE INVENTION

Field of the Invention

Related Art

The present invention relates to a temperature stabilizer and an oscillating apparatus, particularly relates to a temperature stabilizer and an oscillating apparatus for stabilizing the temperature of an oscillator and its perimeter.

SUMMARY OF THE INVENTION

Figure 5:
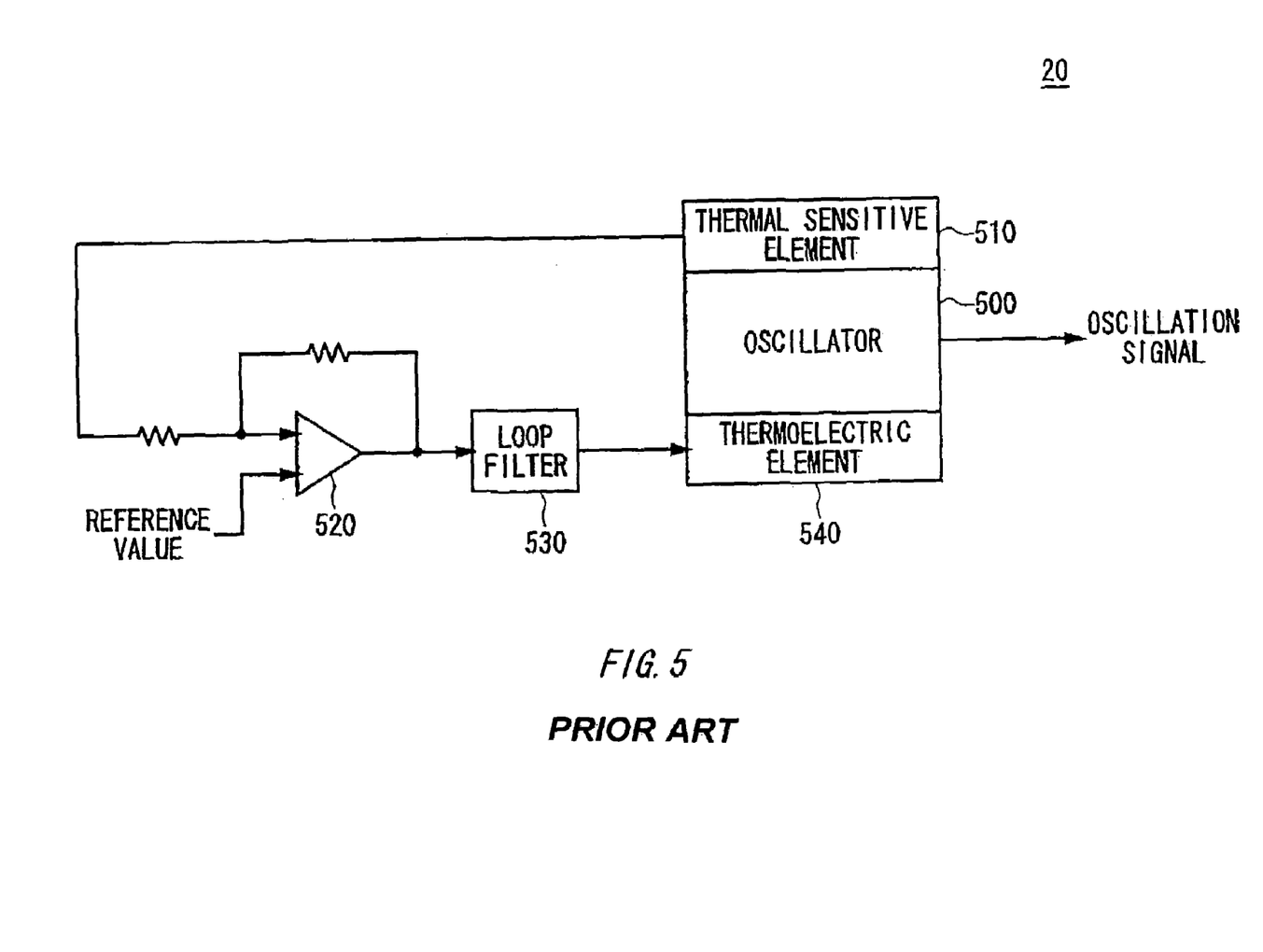
FIG. 5 shows a configuration of the conventional oscillator 20.

Generally, for an oscillating apparatus for outputting oscillation signals having a predetermined frequency, a technology for preventing the oscillation frequency from fluctuating by keeping the temperature of the oscillator constant. FIG. 5 is a conventional example of an oscillating apparatus 20 for stabilizing the temperature.

The oscillating apparatus 20 includes a thermal sensitive element 510 for detecting the temperature of an oscillator 500, a comparator 520 for comparing the output from the thermal sensitive element 510 with a predetermined reference value to output the difference between the temperature detected by the thermal sensitive element 510 and the reference temperature, a loop filter 530 for outputting a voltage to be applied to a thermoelectric element 540 responsive to the output from the comparator 520 and the thermoelectric element 540 for heating or cooling the oscillator 500 responsive to the voltage from the loop filter 530. Thereby in the oscillator 20, the thermoelectric element 540 heats or cools the oscillator 500 to keep the temperature of the oscillator 500, which detected by the thermal sensitive element 510, constant.

Next, the sensitivity of temperature detecting when a thermistor is used as the thermal sensitive element 510 is described. Where, a resistance value R at a temperature T(K) of the thermistor can be obtained by the following equation (1):

$$R = R_0 \exp\left\{B\left(\frac{1}{T} - \frac{1}{T_0}\right)\right\} \quad (1)$$

Were, Ro is the resistance value at a temperature $T_0$.

B(K) represents the magnitude of the change of the resistance value of the thermistor. B can be approximated to a constant by the following equation (2) including the resistance value $R_0$ of the thermistor at the temperature $T_0$ and the resistance value $R_1$ at the temperature $T_1$:

$$B = l_n\left(\frac{\frac{R_1}{R_0}}{\frac{1}{T_1} - \frac{1}{T_0}}\right)(K) \quad (2)$$

Rate of change α when the temperature of the thermistor changes by 1 degree centigrade (=1 K) can be obtained by the following equation (3) by differentiating the equation (1):

$$\alpha = \frac{1}{R} \cdot \frac{dR}{dT} \times 100(\%) = \frac{-B}{T^2} \times 100(\%) \quad (3)$$

For example, when B is 3435(K), the rate of change α at the temperature 25 degrees centigrade (298 K) is (−3435 K)/(298 K)$^2$×100%=−3.9%/degrees centigrade.

When one end of the thermistor is contacted to ground and applied a constant current I thereto, the resistance value is changed along with changing the temperature of the thermistor, so that the voltage $V_{out}$ of the other end of the thermistor is changed. For the above example, the voltage $V_{out}$ is changed by 390 mv/degrees centigrade when the temperature is changed by 1 degree centigrade provided that voltage $V_{out}$ of the thermistor is 10V. Accordingly, the sensitivity of temperature detecting by the thermistor in this case is 390 mV/degrees centigrade (390 mV per 1 degree centigrade).

Here, any prior art document can not be found, so that the description is omitted.

In the above described prior art, the thermal sensitive element 510 is disposed close to the oscillator 500. Here, a certain amount of the temperature difference occurs between the thermal sensitive element 510 and the oscillator 500. Therefore, it is difficult to keep the temperature of the oscillator 500 itself constant. Additionally, since the sensitivity of temperature detecting of the thermal sensitive element 510 is not sufficient, it is difficult to stabilize accurately the temperature of the oscillator 500.

More specifically, the oscillation frequency F(Hz) of VCO (Voltage Controlled Oscillator) is represented by F=K·Vc+ k·T+$f_0$. For the VCO which operates with a high frequency, k is such as 1 MHz/degree centigrade, so that the frequency is shifted by extended to 1 MHz if the temperature changes by just 1 degree centigrade. Meanwhile when a laser oscillator is used as an oscillator, k is such as 10 GHz/degree centigrade, so that the difference of the optical frequency becomes larger.

Thus, the object of the present invention is to provide a temperature stabilizer and an oscillating apparatus which can solve the above described problems. This object is achieved by combining the features recited in independent claims. Then, dependent claims define further effective specific example of the present invention.

According to a first embodiment of the present invention, a temperature stabilizer for stabilizing the temperature of an object to a reference temperature is provided. The temperature stabilizer includes an oscillator provided close to the object, for generating an oscillation signal having a frequency corresponding to an inputted frequency control signal, a phase detector for detecting the phase difference between a feedback signal based on the oscillation signal and a reference clock signal having a predetermined frequency, a loop filter for generating the frequency control signal to synchronize the feedback signal with the reference clock signal based on the output from the phase detector, a comparator for comparing the value of the frequency control signal with a reference value determined corresponding to the reference temperature and an electric heating converter for heating or cooling the object based on the comparison result from the comparator.

The oscillator may generate a laser beam having an optical frequency corresponding to the frequency control signal as the oscillation signal and include an optical coupler for interfering the laser beam with a reference beam having a predetermined optical frequency to output an interference beam having a frequency which is the difference between the frequency of the laser beam and that of the reference beam, and a photoreceiver for receiving the interference beam and outputting the feedback signal having a frequency which is the difference between an optical frequency of the laser beam and that of the reference beam.

Additionally, the oscillator may generate a laser beam having an optical frequency corresponding the frequency control signal as the oscillation signal and include an optical phase modulator for phase-modulating the laser beam by the reference clock signal, an optical absorber for receiving the phase-modulated laser beam, absorbing light having a predetermined frequency component and emitting the reminder, and a photoreceiver for receiving the laser beam emitted from the optical absorber and outputting the feedback signal based on the laser beam emitted from the optical absorber.

Further, the oscillator may generate a laser beam which intermittently emits light at the light emitting interval designated by the inputted frequency control signal as the oscillation signal and include a photoreceiver for outputting the feedback signal having a frequency according to the light emitting interval of the laser beam.

According to a second embodiment of the present invention, an oscillating apparatus is provided, which includes an oscillator for generating an oscillation signal having a frequency corresponding to an inputted frequency control signal, a phase detector for detecting the phase deference between a feedback signal based on the oscillation signal and a reference clock signal having a predetermined frequency, a loop filter for generating the frequency control signal to synchronize the feedback signal with the reference clock signal based on the output from the phase detector, a comparator for comparing the value of the frequency control signal with a predetermined reference value, and an electric heating converter for heating or cooling the oscillator based on the comparison result from the comparator.

The oscillator may generate a laser beam having an optical frequency corresponding to the frequency control signal as the oscillation signal and include an optical coupler for interfering the laser beam with a reference beam having a predetermined optical frequency to output an interference beam having the optical frequency which is equal to the difference between the frequency of the laser beam and that of the reference beam, and a photoreceiver for receiving the interference beam and outputting the feedback signal having the frequency which is equal to the difference between the optical frequency of the laser beam and that of the reference beam.

Additionally, the oscillator may generate a laser beam having an optical frequency corresponding to the frequency control signal as the oscillation signal and include an optical phase modulator for phase-modulating the laser beam by the reference clock signal, an optical absorber for receiving the phase-modulated laser beam, absorbing a particular optical frequency component and emitting the remainder, and a photoreceiver for receiving the laser beam emitted from the optical absorber and outputting the feedback signal based on the laser beam emitted from the optical absorber.

Further, the oscillator may generate a laser beam which intermittently emits light at the light emitting interval designated by the inputted frequency control signal as the oscillation signal and include a photoreceiver for receiving the laser beam to output the feedback signal having a frequency according to the light emitting interval of the laser beam.

Here, all necessary features of the present invention are not listed in the summary of the invention. The sub-combinations of the features may become the invention.

According to the present invention, a temperature stabilizer for accurately stabilizing an oscillator and its perimeter and an oscillating apparatus can be provided.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
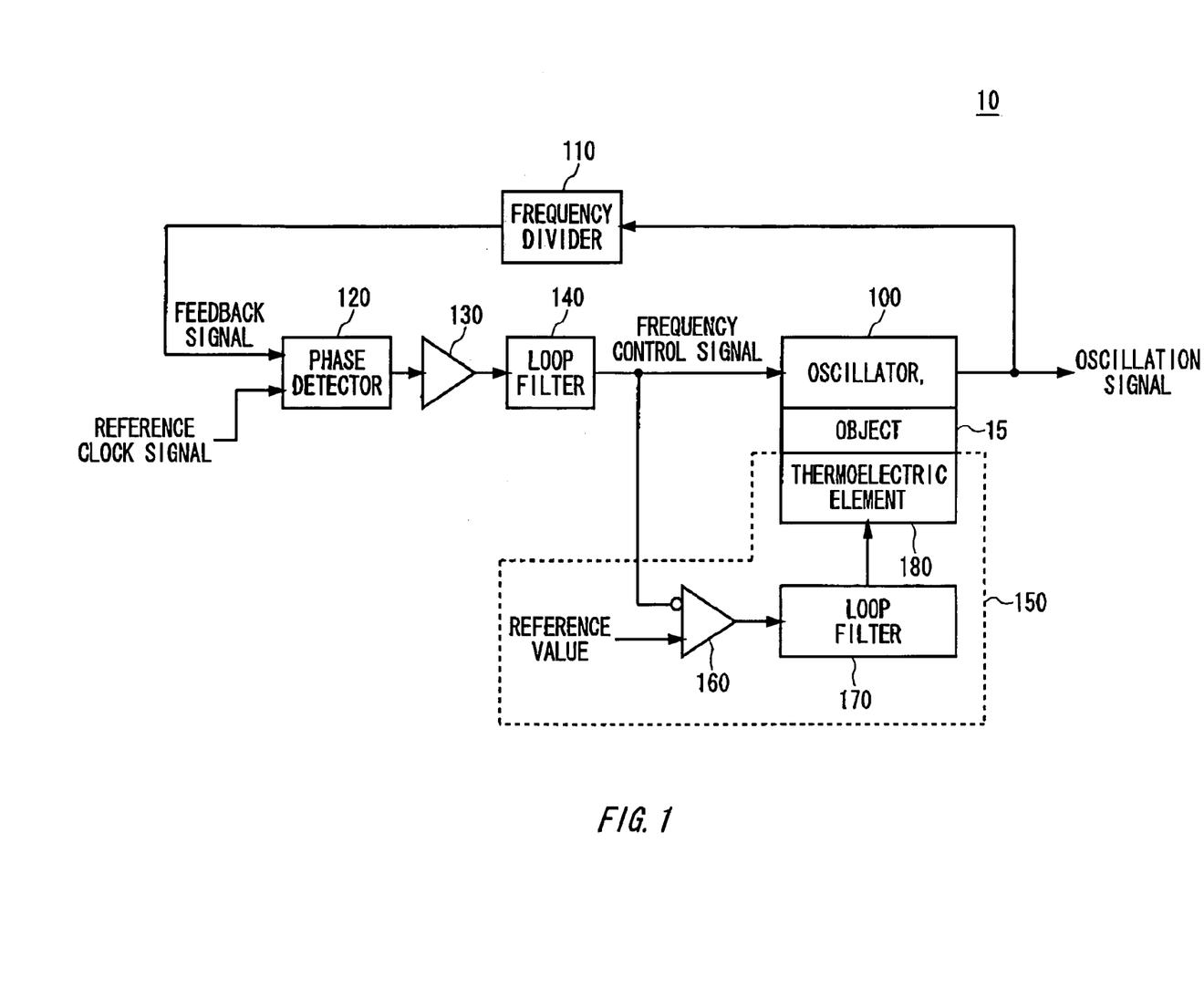
FIG. 1 shows a configuration of a temperature stabilizer 10 according to an embodiment of the present invention.

FIG. 1 shows a configuration of a temperature stabilizer 10 according to an embodiment. In the temperature stabilizer 10 according to the present embodiment, an oscillation signal generated by an oscillator 100 provided close to an object 15 of which temperature is stabilized is negatively feed backed and phase-compared with a reference clock signal. Then, the temperature of the oscillator 100 and the object 15 are regulated based on the phase comparison result. Thereby the temperature stabilizer 10 can be accurately stabilize the oscillator 100 and the object positioned around the oscillator 100.

The temperature stabilizer 10 stabilizes the temperature of the object 15 to a preset reference temperature. The temperature stabilizer 10 includes the oscillator 100, a frequency divider 110, a phase detector 120, a buffer 130, a loop filter 140 and a temperature controller 150. The oscillator 100 generates an oscillation signal having a frequency corresponding to an inputted frequency control signal. The oscillator 100 according to the present embodiment is such as a VCO, which generates an oscillation signal by oscillating with a frequency corresponding the voltage of the inputted frequency control signal.

The frequency divider 110 generates a feedback signal in a feedback loop of the temperature stabilizer 10 based on the oscillation signal. More specifically, the frequency divider 110 generates a feedback signal by dividing the oscillation signal. Alternatively, the temperature stabilizer 10 may use the oscillation signal as the feedback signal.

The phase detector 120 detects a phase difference between the feedback signal based on the oscillation signal and a reference clock signal having a predetermined frequency. Then, the phase detector 120 outputs a phase difference signal indicative of the phase difference. The buffer 130 amplifies the phase difference signal to provide the same to the loop filter 140.

The loop filter 140 generates a frequency control signal to synchronize the feedback signal with the reference clock signal based on the output from the phase detector 120. Thereby the loop filter 140 can control the oscillation frequency of the oscillator 100 such that the frequency of the feedback signal is substantially the same as that of the reference clock signal and the phase difference is kept approximately constant.

If a phase difference signal indicating that the phase of the feedback signal delays in comparison with the phase of the reference clock signal is inputted, the loop filter 140 outputs to the oscillator 100 a frequency control signal indicating that the oscillation frequency of the oscillator 100 should be higher. More specifically, if the oscillator 100 is a VCO of which oscillation frequency becomes higher by providing higher control voltage, the loop filter 140 outputs the frequency control signal with higher voltage.

Additionally, if a phase difference signal indicating that the phase of the reference clock signal delays in comparison with the phase of the feedback signal is inputted, the loop filter 140 outputs to the oscillator 100 a frequency control signal indicating that the oscillation frequency of the oscillator 100 should be lower. More specifically, if the oscillator is a VCO of which oscillation frequency becomes higher by providing higher control voltage, the loop filter 140 outputs the frequency control signal with lower voltage.

The temperature controller 150 controls the temperature of the oscillator 100 based on the frequency control signal outputted from the loop filter 140.

The temperature controller 150 according to the present embodiment includes a comparator 160, a loop filter 170 and a thermoelectric element 180. The comparator 160 compares the value of the frequency control signal with a predetermined reference value. For example, the reference value may be a voltage value of the frequency control signal corresponding to a reference temperature set by any user of the temperature stabilizer 10. Here, the comparator 160 may output a value which is obtained by subtracting the voltage of the frequency control signal outputted by the loop filter 140 from the voltage corresponding to the reference value.

The loop filter 170 inputs the comparison result by the comparator 160 and converts the inputted value to a voltage to be applied to the thermoelectric element 180. The thermoelectric element 180 is an example of an electric heating converter. The thermoelectric element 180 heats or cools the oscillator 100 based on the comparison result which is converted by the loop filter 170. Here, the thermoelectric element 180 may be a heater or a Peltier device.

More specifically, in the temperature stabilizer 10 of which value of the frequency control signal is smaller along with decreasing the temperature of the oscillator 100, alternatively, the value of the frequency control signal is larger along with increasing the temperature of the oscillator 100, the loop filter 170 increases the temperature of the oscillator 100 and the object 15 by increasing the temperature of the thermoelectric element 180 when the frequency control signal of which value is less than the reference value is inputted. Alternatively, when the frequency control signal of which value is more than the reference value, the loop filter 170 decreases the temperature of the oscillator 100 and the object 15 by decreasing the temperature of the thermoelectric element 180.

Meanwhile, in the temperature stabilizer 10 of which value of the frequency control signal is larger along with decreasing the temperature of the oscillator 100, alternatively, the value of the frequency control signal is smaller along with increasing the temperature of the oscillator 100, the loop filter 170 decreases the temperature of the oscillator 100 and the object 15 by decreasing the temperature of the thermoelectric element 180 when the frequency control signal of which value is less than the reference value. Alternatively, when the frequency control signal of which value is more than the reference value, the loop filter 170 increases the temperature of the oscillator 100 and the object 15 by increasing the temperature of the thermoelectric element 180.

According to the above-described temperature controller 150, the temperature of the oscillator 100 and the object are controlled based on the frequency control signal outputted by the loop filter 140. Thereby the temperature stabilizer 10 can stabilize the temperature of the oscillator 100 and the object 15 to the reference temperature corresponding to the reference value inputted to the comparator 160.

As described above, the temperature stabilizer 10 according to the present embodiment stabilizes the temperature of the oscillator 100 and the object 15 to the preset reference temperature using the oscillator 100 as a temperature sensor. Next, the sensitivity of temperature detection when the frequency control signal based on the oscillation signal of the oscillator 100 is employed will be described.

An oscillation frequency F of the oscillator 100 is represented by the following formula (4):

$$F = K \cdot V_c + k \cdot T + f_0 \quad (4)$$

Where, $V_c$ is a voltage of the frequency control signal; K is a voltage coefficient indicative of the frequency change when the voltage of the frequency control signal changes by 1V; k is a temperature coefficient indicative of the frequency change when the temperature of the oscillator 100 changes by 1 degree centigrade; $f_0$ is an oscillation frequency when $V_c$ is 0V and T is 0K.

In the steady state, if the oscillation frequency F is N-divided by the frequency divider 110 through the feedback loop of the temperature stabilizer 10, the divided frequency is equal to a frequency fr of the reference clock signal. Therefore, the following formula (5) is obtained;

$$N \cdot f_r = K \cdot V_c + k \cdot T + f_0 \Rightarrow V_c = \frac{1}{K}(N \cdot f_r - f_0 - k \cdot T) \quad (5)$$

For a microwave oscillator with k=1 MHz/degree centigrade and K=100 kHz/V, $\partial V_c / \partial T = -k/K = -10$V/degree centigrade. Accordingly, the voltage of the frequency control signal changes by 10V for the temperature change 1 degree centigrade of the oscillator 100. Therefore, the sensitivity of temperature detection of the frequency control signal is significantly higher than the sensitivity of temperature detection by a conventional thermister which is 0.4V/degrees centigrade.

The temperature controller 150 controls the temperature of the oscillator 100 and the object 15 based on the above-described frequency control signal. Thereby the temperature controller 150 can accurately stabilize the temperature of the oscillator 100 and the object 15.

Here, the temperature stabilizer 10 may operate as an oscillating apparatus for outputting externally the oscillation signal of the oscillator 100 as a clock signal. More specifically, the thermoelectric element 180 is provided in proximity to the oscillator 100 so as to control the temperature of the oscillator 100. Thereby the temperature controller 150 can accurately stabilize the temperature of the oscillator 100. Therefore, the temperature stabilizer 10 which operates as an oscillating apparatus can output the oscillation signal having an accurately stabilized frequency.

When the temperature stabilizer 10 operates as an oscillator, a reference value of the frequency control signal to be inputted to the comparator 160 may set such that the temperature of the thermoelectric element 180 is the central temperature of the temperature span being able to be provided by the thermoelectric element 180 while the oscillator outputs the oscillation signal having a desired frequency.

When the temperature stabilizer 10 operates as an oscillator, the voltage $V_c$ of the frequency control signal changes based on the temperature of the oscillator 100 itself. Therefore, the problem, regarding the conventional oscillator including the thermister positioned adjacent thereto, that the difference of temperature between the oscillator 100 and the thermister occurs can be solved. Additionally, when the voltage $V_c$ of the frequency control signal increases in order to compensate the change of the oscillation frequency along with decreasing the temperature of the oscillator 100, the temperature controller 150 heats the oscillator 100 to increase the oscillation frequency of the oscillator 100, so that the voltage of the frequency control signal can be kept approximately center of the range of the control signal. Thereby the problem for the temperature stabilizer 10 that the voltage of the frequency control signal is exceeded the range of the control signal along with significantly changing the temperature and as a result the operation is destabilized can be solved.

Figure 2:
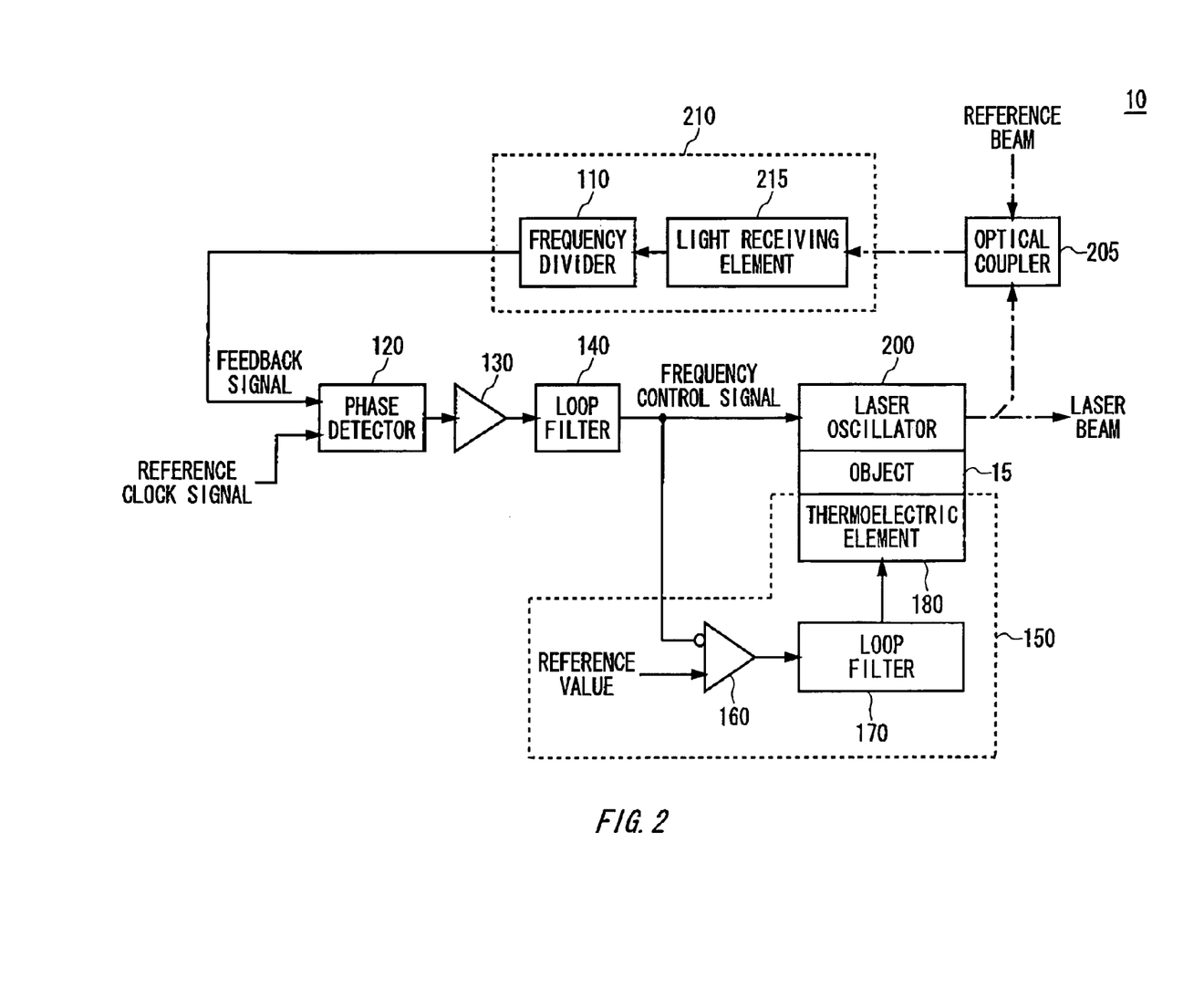
FIG. 2 shows the temperature stabilizer 10 according to a first modification of the embodiment of the present invention.

FIG. 2 shows the temperature stabilizer 10 according to a first modification of the present embodiment. The temperature stabilizer 10 according to the present modification uses a laser oscillator 200 as an oscillator and controls the temperature of the laser oscillator 200 to stabilize an optical frequency of the laser beam outputted from the laser oscillator 200. Thereby the temperature stabilizer 10 can stabilize the temperature of the laser oscillator 200 and the object 15. Here, the members in FIG. 2 given reference numerals same as FIG. 1 have the function and the configuration approximately same as FIG. 1, so that the description is omitted except for the difference.

The laser oscillator 200 generates a laser beam having an optical frequency F corresponding to the frequency control signal as an oscillation signal. The laser oscillator 200 according to the present modification outputs a laser beam having the optical frequency corresponding to a current $I_c$ of an inputted frequency control signal. When the temperature stabilizer operates as a laser oscillating apparatus (laser light source), the laser beam is branched, and one of which is outputted externally and the other of which is inputted to an optical coupler 205.

The optical coupler 205 interferes the laser beam with a reference beam having a predetermined optical frequency Fr. Then, the optical coupler 205 outputs an interference beam having an optical frequency (F−Fr) which is equal to the difference between the optical frequency of the laser beam and that of the reference beam.

The photoreceiver 210 includes a light receiving element 215 for receiving the interference light outputted from the optical coupler 205 and photoelectrically converting the same, and a frequency divider 110 for dividing the electrical signal of the interference beam and outputting a feedback signal having the frequency (F−Fr) which is equal to the difference between the optical frequency of the laser beam and that of the reference beam. The feedback signal is synchronized with a reference clock signal fr through the feedback loop of the temperature stabilizer 10. Thereby the optical frequency of the laser beam emitted from the laser oscillator 200 is locked onto Fr+fr.

The temperature stabilizer 10 according to the present modification can accurately stabilize the temperature of the laser oscillator 200 and the object 15 based on the frequency control signal outputted by the loop filter 140 as well as shown in FIG. 1. If the laser oscillator 200 is a DFB laser oscillator in which the temperature coefficient k is 10 GHz/degree centigrade, and the amount of change of the oscillation frequency K when the current of the frequency control signal changes by 1 mA is 25 MHz/mA, the sensitivity of temperature detection $\partial Ic/\partial T=-400$ mA/degree centigrade can be obtained.

Figure 3:
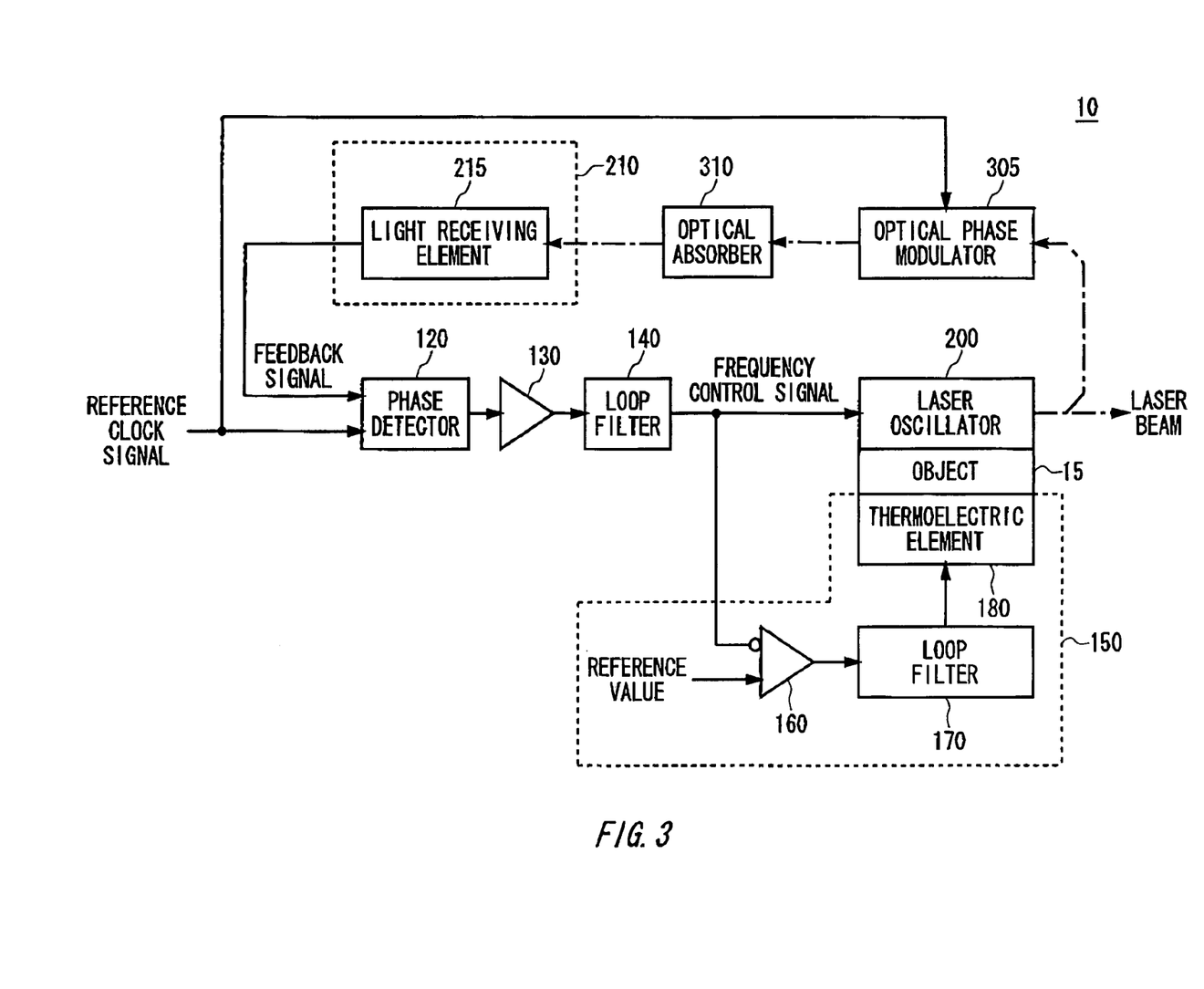
FIG. 3 shows the temperature stabilizer 10 according to a second modification of the embodiment of the present invention.

FIG. 3 shows the temperature stabilizer 10 according to a second modification of the present embodiment. The temperature stabilizer 10 according to the present modification uses the laser oscillator 200 as an oscillator and controls the temperature of the laser oscillator 200 to stabilize an optical frequency of the laser beam outputted from the laser oscillator 200. Thereby the temperature stabilizer 10 can stabilize the temperature of the laser oscillator 200 and the object 15. Additionally, the temperature stabilizer 10 can operate a laser oscillating apparatus (laser light source) for outputting a laser beam. Here, the members in FIG. 3 given reference numerals same as FIG. 1 have the function and the configuration approximately same as FIG. 2, so that the description is omitted except for the difference.

An optical phase modulator 305 phase-modulates the laser beam outputted from the laser oscillator 200 by a reference clock signal. An optical absorber 310 receives the phase-modulated laser beam, absorbs light having a particular optical frequency component and emits the reminder. For example, the optical absorber 310 is a gas cell which encloses a gas such as acetylene, cyanogen, rubidium, potassium or sodium in a glass vessel. The optical absorber 310 absorbs the frequency component of the specific optical frequency $F_0$ among the frequency component of the phase-modulated laser beam.

The photoreceiver 210 includes the light receiving element 215 for receiving the laser beam emitted from the optical absorber 310, photoelectrically converting the same and outputting a feedback signal based on the laser beam outputted from the optical absorber 310.

According to the temperature stabilizer 10 of the present modification, the phase detector 120 phase-sensitively detects the reference clock signal and the feedback signal. Thereby the optical frequency F of the laser beam corresponds to the absorbing frequency $F_0$ in the steady state so that the following equation (6) can be obtained:

$$F_0 = K \cdot I_c + k \cdot T + f_0 \Rightarrow I_c = \frac{1}{K}(F_0 - k \cdot T - f_0) \tag{6}$$

If the laser oscillator 200 is a DFB laser oscillator in which the temperature coefficient k is 10 GHz/degree centigrade, and the amount of change of the oscillation frequency K when the current of the frequency control signal changes by 1 mA is 25 MHz/mA, the sensitivity of temperature detection $\partial Ic/\partial T=-400$ mA/degree centigrade can be obtained.

Figure 4:
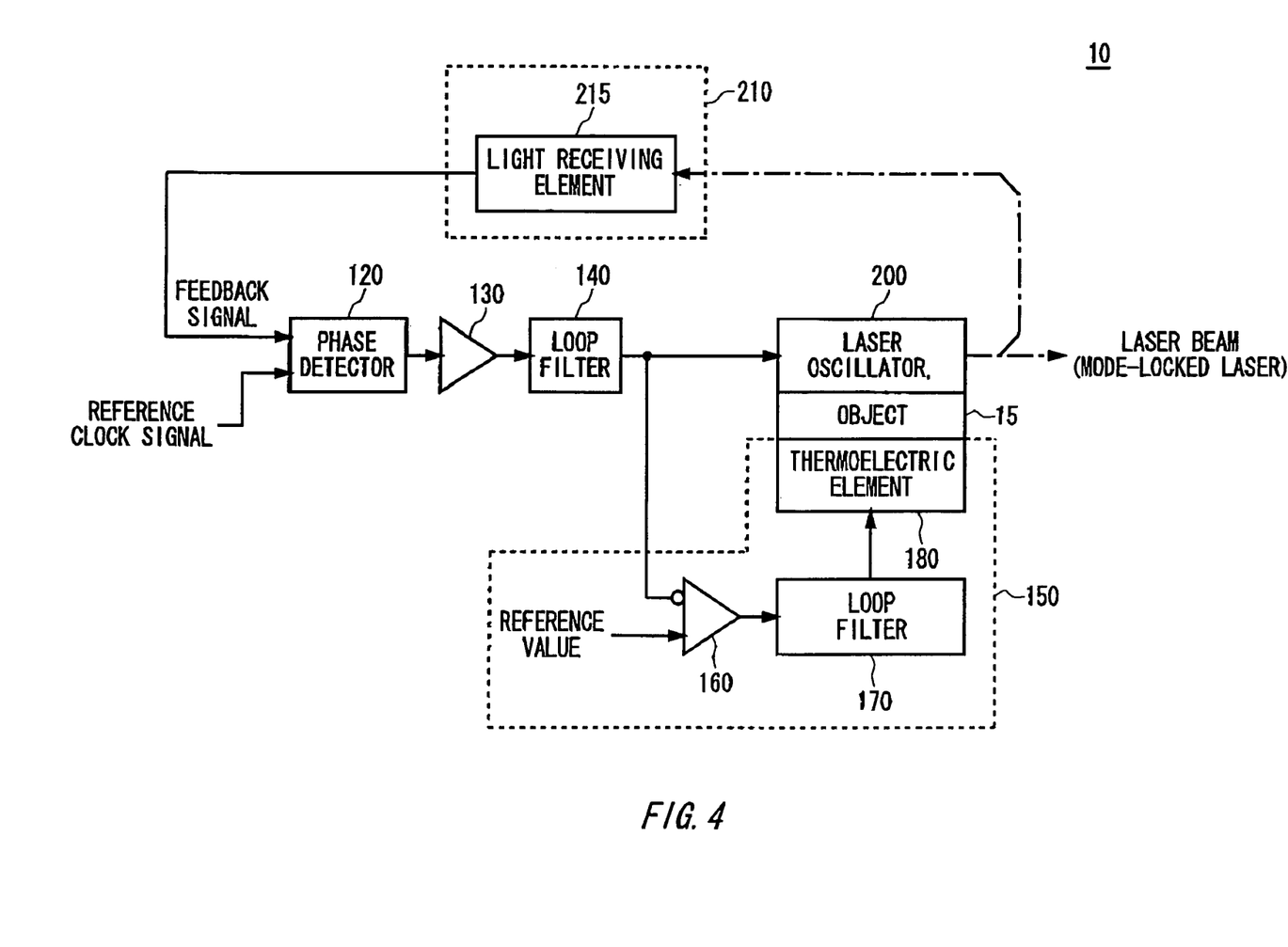
FIG. 4 shows the temperature stabilizer 10 according to a third modification of the embodiment of the present invention.

FIG. 4 shows the temperature stabilizer 10 according to a third modification of the present embodiment. The temperature stabilizer 10 uses the laser oscillator 200 for outputting a mode-locked laser beam as an oscillator and controls the temperature of the laser oscillator 200 to stabilize the repetition frequency of the pulsed light outputted from the laser oscillator 200. Thereby the temperature stabilizer 10 can stabilize the temperature of the laser oscillator 200 and the object 15. Here, the members in FIG. 4 given reference numerals same as FIG. 1 have the function and the configuration approximately same as FIG. 1, so that the description is omitted except for the difference.

The laser oscillator 200 emits the pulsed light based on an inputted frequency control signal and outputs the mode-locked laser beam. That is to say, the laser oscillator 200 generates a laser beam which intermittently emits a light at the light emitting interval designated by the inputted frequency control signal as the oscillation signal. When the temperature stabilizer operates as an oscillator, the laser beam is branched, and one of which is outputted externally and the other of which is inputted to the photoreceiver 210.

The photoreceiver 210 includes the light receiving element 215 for receiving the laser beam, photoelectrically converting the same and outputting a feedback signal having the frequency according to the light emitting interval of the laser beam.

The temperature stabilizer 10 according to the present modification can generate the frequency control signal which synchronizes the feedback signal having the frequency according to the pulse interval of the mode-locked laser beam (repetition frequency) with the reference clock signal and accurately stabilize the temperature of the laser oscillator 200 and the object 15 based on the frequency control signal. For the laser oscillator 200 which emits the mode-locked laser beam having the repetition frequency 50 MHz, the temperature coefficient k is 200 Hz/degree centigrade, and the amount of change K of the repetition frequency when the voltage of the frequency control signal changes by 1V is 2 Hz/V, for example. In this case, the sensitivity of temperature detection $\partial Ic/\partial T=-100V/degree$ centigrade can be obtained by the frequency control signal.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

For example, the above described oscillator 100 and laser oscillator 200 may be a LC, a dielectric, a microwave oscillator such as YIG, and a laser oscillator such as a semiconductor laser, a solid-state laser, a fiber laser or a gas laser.

Additionally for example, the temperature controller 150 may further include a temperature control stop unit for stopping the power supply to the thermoelectric element 180 so that the thermoelectric element 180 stops heating or cooling the oscillator 100 and the laser oscillator 200 when the value of the frequency control signal falls within a predetermined value. Thereby the temperature controller 150 can stop controlling the temperature of the oscillator 100 or the laser oscillator 200 to operate with a low power consumption when the value of the frequency control signal falls within a predetermined value.

What is claimed is:

1. A temperature stabilizer for stabilizing the temperature of an object to a reference temperature, comprising:
   an oscillator provided in proximity to the object for generating an oscillation signal having a frequency corresponding to an inputted frequency control signal;
   a phase detector for detecting a phase difference between a feedback signal based on the oscillation signal generated by the oscillator based on the inputted frequency control signal and a reference clock signal having a predetermined frequency;
   a loop filter for receiving the feedback signal and generating the frequency control signal inputted to the oscillator to synchronize the feedback signal with the reference clock signal based on the output from the phase detector;
   a comparator for receiving the frequency control signal generated by the loop filter and comparing the value of the frequency control signal with a reference value determined corresponding to the reference temperature; and
   an electric heating converter for heating or cooling the object based on the comparison result from the comparator.

2. The temperature stabilizer according to claim 1, wherein the oscillator generates a laser beam having an optical frequency corresponding to the frequency control signal as the oscillation signal and the oscillator comprising:
   an optical coupler for interfering the laser beam with a reference beam having a predetermined optical frequency and outputting an interference beam having an optical frequency which is equal to the difference between the frequency of the laser beam and that of the reference beam; and
   a photoreceiver for receiving the interference beam and outputting the feedback signal having the frequency which is equal to the difference between the optical frequency of the laser beam and that of the reference laser beam.

3. The temperature stabilizer according to claim 1, wherein the oscillator generates a laser beam having an optical frequency corresponding to the frequency control signal as the oscillation signal and the oscillator comprising:
   an optical phase modulator for phase-modulating the laser beam by the reference clock signal;
   an optical absorber for receiving the phase-modulated laser beam, absorbing light with a predetermined optical frequency component and emitting the remainder; and
   a photoreceiver for receiving the laser beam emitted from the optical absorber and outputting the feedback signal based on the laser beam emitted from the optical absorber.

4. The temperature stabilizer according to claim 1, wherein the oscillator generates a laser beam which intermittently emits light at the light emitting interval designated by the inputted frequency control signal as the oscillation signal, and the oscillator further comprises a photoreceiver for receiving the laser beam and outputting the feedback signal having the frequency according to the light emitting interval of the laser beam.

5. An oscillating apparatus comprising:
   an oscillator for generating an oscillation signal having a frequency corresponding to an inputted frequency control signal;
   a phase detector for detecting a phase difference between a feedback signal based on the oscillation signal generated by the oscillator based on the inputted frequency control signal and a reference clock signal having a predetermined frequency;
   a loop filter for receiving the feedback signal and generating the frequency control signal inputted to the oscillator to synchronize the feedback signal with the reference clock signal based on the output of the phase detector;

a comparator for receiving the frequency control signal generated by the loop filter and comparing the value of the frequency control signal with a predetermined reference value; and an electric heating converter for heating or cooling the oscillator based on the comparison result from the comparator.

6. The oscillating apparatus according to claim 5, wherein the oscillator generates a laser beam having an optical frequency corresponding to the frequency control signal as the oscillation signal, and the oscillator comprising:

an optical coupler for interfering the laser beam with a reference beam having a predetermined optical frequency and outputting an interference beam having an optical frequency which is equal to the difference between the optical frequency of the laser beam and that of the reference beam; and a photoreceiver for receiving the interference beam and outputting the feedback signal having a frequency which is equal to the difference between the optical frequency of the laser beam and that of the reference beam.

7. The oscillating apparatus according to claim 5, wherein the oscillator generates a laser beam having the optical frequency corresponding to the frequency control signal as the oscillation signal, and the oscillator comprising:

an optical phase modulator for phase-modulating the laser beam by the reference clock signal;

an optical absorber for receiving the phase-modulated laser beam, absorbing light with a predetermined frequency component and emitting the remainder; and a photoreceiver for receiving the laser beam emitted from the optical absorber and outputting the feedback signal based on the laser beam emitted from the optical absorber.

8. The oscillating apparatus according to claim 5, wherein the oscillator generates a laser beam which intermittently emits light at the light emitting interval designated by the inputted frequency control signal as the oscillation signal, and further comprises a photoreceiver for receiving the laser beam and outputting the feedback signal having the frequency according to the light emitting interval of the laser beam.

* * * * *